(12) United States Patent
Cai et al.

(10) Patent No.: US 10,644,712 B2
(45) Date of Patent: May 5, 2020

(54) COARSE ADJUSTMENT CELL ARRAY APPLIED TO DIGITALLY CONTROLLED OSCILLATOR AND RELATED APPARATUS

(71) Applicant: Huawei Technologies Co., Ltd., Shenzhen, Guangdong (CN)

(72) Inventors: Fei Cai, Shenzhen (CN); Shenghua Zhou, Shenzhen (CN)

(73) Assignee: HUAWEI TECHNOLOGIES CO., LTD., Shenzhen, Guangdong (CN)

(*) Notice: Subject to any disclaimer, the term of this patent is extended or adjusted under 35 U.S.C. 154(b) by 160 days.

(21) Appl. No.: 15/858,998

(22) Filed: Dec. 29, 2017

(65) Prior Publication Data

US 2018/0123606 A1 May 3, 2018

Related U.S. Application Data

(63) Continuation of application No. PCT/CN2016/087706, filed on Jun. 29, 2016.

(30) Foreign Application Priority Data

Jun. 30, 2015 (CN) .......................... 2015 1 0375644

(51) Int. Cl.
*H03L 7/14* (2006.01)
*H03L 7/099* (2006.01)
(Continued)

(52) U.S. Cl.
CPC .............. *H03L 7/148* (2013.01); *H03L 7/085* (2013.01); *H03L 7/099* (2013.01); *H03L 7/105* (2013.01);
(Continued)

(58) Field of Classification Search
CPC . H03L 7/14; H03L 7/148; H03L 7/099; H03L 7/187; H03L 2207/06; H03L 7/105; H03L 7/085
(Continued)

(56) References Cited

U.S. PATENT DOCUMENTS 8,125,285 B2 2/2012 Titus
8,299,862 B1 10/2012 De Barnardinis et al.
(Continued)

FOREIGN PATENT DOCUMENTS

CN 101662260 A 3/2010
CN 101800539 A 8/2010
(Continued)

OTHER PUBLICATIONS

Grollitsch et al; "A 1.4psrms-Period-Jitter TDC-Less Fractional-N Digital PLL with Digitally Controlled Ring Oscillator in 65nm CMOS"; ISSCC 2010 / Session 26 / High-Performance and Digital PLLs / 26.6; Feb. 7-11, 2010; San Francisco, CA, USA; 3 pages.
(Continued)

*Primary Examiner* — Arnold M Kinkead
(74) *Attorney, Agent, or Firm* — Womble Bond Dickinson (US) LLP

(57) ABSTRACT

The disclosure discloses a coarse adjustment cell array applied to a digitally controlled oscillator and a related apparatus. The coarse adjustment cell array applied to the digitally controlled oscillator includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse
(Continued)

adjustment cell i work, Y is an integer greater than 1, and X and W are integers greater than 1.

12 Claims, 5 Drawing Sheets

(51) Int. Cl.
    *H03L 7/18*     (2006.01)
    *H03L 7/187*     (2006.01)
    *H03L 7/10*     (2006.01)
    *H03L 7/085*     (2006.01)

(52) U.S. Cl.
    CPC .................. *H03L 7/14* (2013.01); *H03L 7/18* (2013.01); *H03L 7/187* (2013.01); *H03L 2207/06* (2013.01)

(58) Field of Classification Search
    USPC .............. 331/167, 177 V, 158; 327/142, 159
    See application file for complete search history.

(56) References Cited

U.S. PATENT DOCUMENTS

| | | |
|---|---|---|
| 2009/0278620 A1 | 11/2009 | Taghivand et al. |
| 2009/0302958 A1 | 12/2009 | Sakurai et al. |
| 2010/0052795 A1 | 3/2010 | Nakamura et al. |
| 2010/0148881 A1 | 6/2010 | Moussavi |
| 2010/0156550 A1 | 6/2010 | Oh et al. |
| 2011/0121910 A1* | 5/2011 | Yang ...................... H03L 1/023 331/36 C |
| 2014/0347137 A1 | 11/2014 | Rey et al. |
| 2016/0065227 A1* | 3/2016 | Ainspan .................. H03B 1/00 331/8 |

FOREIGN PATENT DOCUMENTS

| | | |
|---|---|---|
| CN | 102017422 A | 4/2011 |
| CN | 104980152 A | 10/2015 |
| WO | 2009137620 A1 | 11/2009 |

OTHER PUBLICATIONS

Zianbetov et al; "A Digitally Controlled Oscillator in a 65-nm CMOS process for SoC clock generation", 2011 IEEE International Symposium on Circuits and Systems (ISCAS); May 15-18, 2011; Rio de Janeiro, Brazil; 4 pages.

August et al; "A TDC-Less ADPLL with 200-to-3200MHz Range and 3mW Power Dissipation for Mobile SoC Clocking in 22nm CMOS"; ISSCC 2012 / Session 14 / Digital Clocking and PLLs / 14.4; Feb. 19-23, 2012; San Francisco, CA, USA; 3 pages.

* cited by examiner

COARSE ADJUSTMENT CELL ARRAY APPLIED TO DIGITALLY CONTROLLED OSCILLATOR AND RELATED APPARATUS

CROSS-REFERENCE TO RELATED APPLICATIONS

This application is a continuation of International Application No. PCT/CN2016/087706, filed on Jun. 29, 2016, which claims priority to Chinese Patent Application No. 201510375644.3, filed on Jun. 30, 2015, both of which are hereby incorporated by reference in their entireties.

TECHNICAL FIELD

The present application relates to the field of electronic technologies, and specifically, to a coarse adjustment cell array applied to a digitally controlled oscillator and a related apparatus.

BACKGROUND

A digitally controlled oscillator (DCO) is an extremely common circuit element, and the DCO is widely used in many circuits (such as a phase-locked loop circuit).

The DCO controls a frequency of the oscillator by using discrete digital signals, and therefore, the frequency of the DCO is discrete. A changed step of the frequency is a function of a digital control bit. This feature of the DCO is different from frequency change continuity of a conventional analog voltage-controlled oscillator. A minimum step of the DCO directly determines quantization noise contributed by the DCO. A smaller frequency step of the DCO leads to lower quantization noise contributed by the DCO. However, if a frequency step is smaller, a larger quantity of capacitor cells (coarse adjustment/fine adjustment cells) are usually required to cover a same frequency range, more digital control bits are usually required, and more control cables are also required to transmit the digital control bits. Therefore, the control cables may be a main factor that determines a layout area, and the control cables may be even redundant to become a circuit layout design bottleneck.

A capacitor cell in a capacitor array of a conventional DCO uses temperature code for a layout, and converts binary code to temperature code by using a row-column decoder. Each capacitor cell selects a row control cable and a column control cable by using the row-column decoder, to control the capacitor cell to work or not to work (not working means disabling). Enabling and disabling of each capacitor cell is corresponding to an increase or a decrease of an oscillator frequency. In principle, there is a monotonically linear relationship between a frequency of a digitally controlled oscillator and enabling and disabling of each capacitor cell.

The capacitor array of the conventional DCO includes a fine adjustment cell array and a coarse adjustment cell array. The fine adjustment cell array includes multiple fine adjustment cells (a fine adjustment cell may also be referred to as a fine adjustment capacitor cell in some scenarios). The coarse adjustment cell array includes multiple coarse adjustment cells (a coarse adjustment cell may also be referred to as a coarse adjustment capacitor cell in some scenarios). A coarse adjustment cell has a larger frequency step, and a fine adjustment cell has a smaller frequency step. Therefore, there is a problem of carry from the fine adjustment cell to the coarse adjustment cell. However, in the capacitor array of the conventional DCO, there is usually a mismatch (Mismatch) problem during the carry from the fine adjustment cell to the coarse adjustment cell. Practice shows that the mismatch directly affects circuit performance, and sometimes, impact of the mismatch on the circuit performance reaches an extent that cannot be ignored.

SUMMARY

Embodiments of the present disclosure provide a coarse adjustment cell array applied to a digitally controlled oscillator and a related apparatus, to avoid a mismatch problem as far as possible, so as to improve related circuit performance.

A first aspect of the embodiments of the present disclosure provides a coarse adjustment cell array applied to a digitally controlled oscillator, where the coarse adjustment cell array includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, the coarse adjustment cell i is any coarse adjustment cell in the coarse adjustment cell array, Y is an integer greater than 1, X is an integer greater than 1, and W is an integer greater than 1.

With reference to the first aspect, in a first possible implementation of the first aspect, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work, where the first value, the second value, and the third value are different from each other.

With reference to the first possible implementation of the first aspect, in a second possible implementation of the first aspect, there is a one-to-one correspondence between the W fine adjustment cells in the coarse adjustment cell i and the W fine adjustment control bits input to the logic cell of the coarse adjustment cell i; and if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

With reference to the first aspect, the first possible implementation of the first aspect, or the second possible implementation of the first aspect, in a third possible implementation of the first aspect, W is equal to $2^n$, and n is a positive integer.

With reference to the first aspect, the first possible implementation of the first aspect, the second possible implementation of the first aspect, or the third possible implementation of the first aspect, in a fourth possible implementation of the first aspect, Y is equal to 2.

A second aspect of the embodiments of the present disclosure provides a digitally controlled oscillator, including a coarse adjustment cell array, a coarse adjustment row-column decoder, and a fine adjustment row-column decoder, where the coarse adjustment cell array is any coarse adjustment cell array provided in the embodiments of the present disclosure;

the coarse adjustment row-column decoder is configured to decode an input first control signal, so as to output A coarse adjustment control bits;

the fine adjustment row-column decoder is configured to decode an input second control signal, so as to output B fine adjustment control bits; and a set formed by the Y coarse adjustment control bits is a subset of a set including the A coarse adjustment control bits, and a set including the W fine adjustment control bits is a subset of a set including the B fine adjustment control bits.

With reference to the second aspect, in a first possible implementation of the second aspect, the set including the W fine adjustment control bits is equal to the set including the B fine adjustment control bits, and each coarse adjustment cell in the coarse adjustment cell array shares the W fine adjustment control bits.

With reference to the second aspect or the first possible implementation of the second aspect, in a second possible implementation of the second aspect, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

With reference to the second aspect, the first possible implementation of the second aspect, or the second possible implementation of the second aspect, in a third possible implementation of the second aspect, the coarse adjustment row-column decoder includes A coarse adjustment control bit output cables, and the A coarse adjustment control bits are in a one-to-one correspondence with the A coarse adjustment control bit output cables.

With reference to the second aspect, the first possible implementation of the second aspect, the second possible implementation of the second aspect, or the third possible implementation of the second aspect, in a fourth possible implementation of the second aspect, the fine adjustment row-column decoder includes B fine adjustment control bit output cables, and the B fine adjustment control bits are in a one-to-one correspondence with the B fine adjustment control bit output cables.

With reference to the second aspect, the first possible implementation of the second aspect, the second possible implementation of the second aspect, the third possible implementation of the second aspect, or the fourth possible implementation of the second aspect, in a fifth possible implementation of the second aspect, the coarse adjustment cell array includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, the coarse adjustment cell i is any coarse adjustment cell in the coarse adjustment cell array, Y is an integer greater than 1, X is an integer greater than 1, and W is an integer greater than 1.

With reference to the fifth possible implementation of the second aspect, in a sixth possible implementation of the second aspect, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work, where the first value, the second value, and the third value are different from each other.

With reference to the sixth possible implementation of the second aspect, in a seventh possible implementation of the second aspect, there is a one-to-one correspondence between the W fine adjustment cells in the coarse adjustment cell i and the W fine adjustment control bits input to the logic cell of the coarse adjustment cell i; and if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

With reference to the fifth possible implementation of the second aspect, the sixth possible implementation of the second aspect, or the seventh possible implementation of the second aspect, in an eighth possible implementation of the second aspect, W is equal to $2^n$, and n is a positive integer.

With reference to the fifth possible implementation of the second aspect, the sixth possible implementation of the second aspect, the seventh possible implementation of the second aspect, or the eighth possible implementation of the second aspect, in a ninth possible implementation of the second aspect, Y is equal to 2.

A third aspect of the embodiments of the present disclosure provides a frequency synthesizer, including:

a digitally controlled oscillator and a digital logic cell, where the digitally controlled oscillator is any digitally controlled oscillator provided in the embodiments of the present disclosure, the digital logic cell is configured to output the first control signal to the coarse adjustment row-column decoder, and the digital logic cell is further configured to output the second control signal to the fine adjustment row-column decoder.

With reference to the third aspect, in a first possible implementation of the third aspect, the digital logic cell is configured to output the first control signal to the coarse adjustment row-column decoder according to a frequency dividing control word and a reference frequency that are input to the digital logic cell, and the digital logic cell is further configured to output the second control signal to the fine adjustment row-column decoder according to the frequency dividing control word and the reference frequency that are input to the digital logic cell.

With reference to the third aspect or the first possible implementation of the third aspect, in a second possible implementation of the third aspect, the digitally controlled oscillator includes a coarse adjustment cell array, a coarse adjustment row-column decoder, and a fine adjustment row-column decoder, where the coarse adjustment cell array is any coarse adjustment cell array provided in the embodiments of the present disclosure;

the coarse adjustment row-column decoder is configured to decode an input first control signal, so as to output A coarse adjustment control bits;

the fine adjustment row-column decoder is configured to decode an input second control signal, so as to output B fine adjustment control bits; and a set formed by the Y coarse adjustment control bits is a subset of a set including the A coarse adjustment control bits, and a set including the W fine adjustment control bits is a subset of a set including the B fine adjustment control bits.

With reference to the second possible implementation of the third aspect, in a third possible implementation of the third aspect, the set including the W fine adjustment control bits is equal to the set including the B fine adjustment control bits, and each coarse adjustment cell in the coarse adjustment cell array shares the W fine adjustment control bits.

With reference to the second possible implementation of the third aspect or the third possible implementation of the third aspect, in a fourth possible implementation of the third aspect, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

With reference to the second possible implementation of the third aspect, the third possible implementation of the third aspect, or the fourth possible implementation of the third aspect, in a fifth possible implementation of the third aspect, the coarse adjustment row-column decoder includes A coarse adjustment control bit output cables, and the A coarse adjustment control bits are in a one-to-one correspondence with the A coarse adjustment control bit output cables.

With reference to the second possible implementation of the third aspect, the third possible implementation of the third aspect, the fourth possible implementation of the third aspect, or the fifth possible implementation of the third aspect, in a sixth possible implementation of the third aspect, the fine adjustment row-column decoder includes B fine adjustment control bit output cables, and the B fine adjustment control bits are in a one-to-one correspondence with the B fine adjustment control bit output cables.

With reference to the second possible implementation of the third aspect, the third possible implementation of the third aspect, the fourth possible implementation of the third aspect, the fifth possible implementation of the third aspect, or the sixth possible implementation of the third aspect, in a seventh possible implementation of the third aspect, the coarse adjustment cell array includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, the coarse adjustment cell i is any coarse adjustment cell in the coarse adjustment cell array, Y is an integer greater than 1, X is an integer greater than 1, and W is an integer greater than 1.

With reference to the seventh possible implementation of the third aspect, in an eighth possible implementation of the third aspect, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work, where the first value, the second value, and the third value are different from each other.

With reference to the eighth possible implementation of the third aspect, in a ninth possible implementation of the third aspect, there is a one-to-one correspondence between the W fine adjustment cells in the coarse adjustment cell i and the W fine adjustment control bits input to the logic cell of the coarse adjustment cell i; and if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

With reference to the seventh possible implementation of the third aspect, the eighth possible implementation of the third aspect, or the ninth possible implementation of the third aspect, in a tenth possible implementation of the third aspect, W is equal to $2^n$, and n is a positive integer.

With reference to the seventh possible implementation of the third aspect, the eighth possible implementation of the third aspect, the ninth possible implementation of the third aspect, or the tenth possible implementation of the third aspect, in an eleventh possible implementation of the third aspect, Y is equal to 2.

A fourth aspect of the embodiments of the present disclosure provides a circuit, including a coarse adjustment cell array, where the coarse adjustment cell array includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, the coarse adjustment cell i is any coarse adjustment cell in the coarse adjustment cell array, Y is an integer greater than 1, X is an integer greater than 1, and W is an integer greater than 1.

With reference to the fourth aspect, in a first possible implementation of the fourth aspect, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work, where the first value, the second value, and the third value are different from each other.

With reference to the first possible implementation of the fourth aspect, in a second possible implementation of the fourth aspect, there is a one-to-one correspondence between the W fine adjustment cells in the coarse adjustment cell i and the W fine adjustment control bits input to the logic cell of the coarse adjustment cell i; and if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

With reference to the fourth aspect, the first possible implementation of the fourth aspect, or the second possible implementation of the fourth aspect, in a third possible implementation of the fourth aspect, W is equal to $2^n$, and n is a positive integer.

With reference to the fourth aspect, the first possible implementation of the fourth aspect, the second possible implementation of the fourth aspect, or the third possible implementation of the fourth aspect, in a fourth possible implementation of the fourth aspect, Y is equal to 2.

A fifth aspect of the embodiments of the present disclosure provides a circuit, including a digitally controlled oscillator, where the digitally controlled oscillator includes a coarse adjustment cell array, a coarse adjustment row-column decoder, and a fine adjustment row-column decoder, where the coarse adjustment cell array is any coarse adjustment cell array provided in the embodiments of the present disclosure;

the coarse adjustment row-column decoder is configured to decode an input first control signal, so as to output A coarse adjustment control bits;

the fine adjustment row-column decoder is configured to decode an input second control signal, so as to output B fine adjustment control bits; and a set formed by the Y coarse adjustment control bits is a subset of a set including the A coarse adjustment control bits, and a set including the W fine adjustment control bits is a subset of a set including the B fine adjustment control bits.

With reference to the fifth aspect, in a first possible implementation of the fifth aspect, the set including the W fine adjustment control bits is equal to the set including the B fine adjustment control bits, and each coarse adjustment cell in the coarse adjustment cell array shares the W fine adjustment control bits.

With reference to the fifth aspect or the first possible implementation of the fifth aspect, in a second possible implementation of the fifth aspect, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

With reference to the fifth aspect, the first possible implementation of the fifth aspect, or the second possible implementation of the fifth aspect, in a third possible implementation of the fifth aspect, the coarse adjustment row-column decoder includes A coarse adjustment control bit output cables, and the A coarse adjustment control bits are in a one-to-one correspondence with the A coarse adjustment control bit output cables.

With reference to the fifth aspect, the first possible implementation of the fifth aspect, the second possible implementation of the fifth aspect, or the third possible implementation of the fifth aspect, in a fourth possible implementation of the fifth aspect, the fine adjustment row-column decoder includes B fine adjustment control bit output cables, and the B fine adjustment control bits are in a one-to-one correspondence with the B fine adjustment control bit output cables.

With reference to the fifth aspect, the first possible implementation of the fifth aspect, the second possible implementation of the fifth aspect, the third possible implementation of the fifth aspect, or the fourth possible implementation of the fifth aspect, in a fifth possible implementation of the fifth aspect, the coarse adjustment cell array includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, the coarse adjustment cell i is any coarse adjustment cell in the coarse adjustment cell array, Y is an integer greater than 1, X is an integer greater than 1, and W is an integer greater than 1.

With reference to the fifth possible implementation of the fifth aspect, in a sixth possible implementation of the fifth aspect, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work, where the first value, the second value, and the third value are different from each other.

With reference to the sixth possible implementation of the fifth aspect, in a seventh possible implementation of the fifth aspect, there is a one-to-one correspondence between the W fine adjustment cells in the coarse adjustment cell i and the W fine adjustment control bits input to the logic cell of the coarse adjustment cell i; and if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

With reference to the fifth possible implementation of the fifth aspect, the sixth possible implementation of the fifth aspect, or the seventh possible implementation of the fifth aspect, in an eighth possible implementation of the fifth aspect, W is equal to $2^n$, and n is a positive integer.

With reference to the fifth possible implementation of the fifth aspect, the sixth possible implementation of the fifth aspect, the seventh possible implementation of the fifth aspect, or the eighth possible implementation of the fifth aspect, in a ninth possible implementation of the fifth aspect, Y is equal to 2.

A fifth aspect of the embodiments of the present disclosure provides a circuit, including a frequency synthesizer, where the frequency synthesizer includes:

a digitally controlled oscillator and a digital logic cell, where the digitally controlled oscillator is any digitally controlled oscillator provided in the embodiments of the present disclosure, the digital logic cell is configured to output the first control signal to the coarse adjustment row-column decoder, and the digital logic cell is further configured to output the second control signal to the fine adjustment row-column decoder.

With reference to the sixth aspect, in a first possible implementation of the sixth aspect, the digital logic cell is configured to output the first control signal to the coarse adjustment row-column decoder according to a frequency dividing control word and a reference frequency that are input to the digital logic cell, and the digital logic cell is further configured to output the second control signal to the fine adjustment row-column decoder according to the frequency dividing control word and the reference frequency that are input to the digital logic cell.

With reference to the sixth aspect or the first possible implementation of the sixth aspect, in a second possible implementation of the sixth aspect, the digitally controlled oscillator includes a coarse adjustment cell array, a coarse adjustment row-column decoder, and a fine adjustment row-column decoder, where the coarse adjustment cell array is any coarse adjustment cell array provided in the embodiments of the present disclosure;

the coarse adjustment row-column decoder is configured to decode an input first control signal, so as to output A coarse adjustment control bits;

the fine adjustment row-column decoder is configured to decode an input second control signal, so as to output B fine adjustment control bits; and a set formed by the Y coarse adjustment control bits is a subset of a set including the A coarse adjustment control bits, and a set including the W fine adjustment control bits is a subset of a set including the B fine adjustment control bits.

With reference to the second possible implementation of the sixth aspect, in a third possible implementation of the sixth aspect, the set including the W fine adjustment control bits is equal to the set including the B fine adjustment control bits, and each coarse adjustment cell in the coarse adjustment cell array shares the W fine adjustment control bits.

With reference to the second possible implementation of the sixth aspect or the third possible implementation of the sixth aspect, in a fourth possible implementation of the sixth aspect, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

With reference to the second possible implementation of the sixth aspect, the third possible implementation of the sixth aspect, or the fourth possible implementation of the sixth aspect, in a fifth possible implementation of the sixth aspect, the coarse adjustment row-column decoder includes A coarse adjustment control bit output cables, and the A coarse adjustment control bits are in a one-to-one correspondence with the A coarse adjustment control bit output cables.

With reference to the second possible implementation of the sixth aspect, the third possible implementation of the sixth aspect, the fourth possible implementation of the sixth aspect, or the fifth possible implementation of the sixth aspect, in a sixth possible implementation of the sixth aspect, the fine adjustment row-column decoder includes B fine adjustment control bit output cables, and the B fine adjustment control bits are in a one-to-one correspondence with the B fine adjustment control bit output cables.

With reference to the second possible implementation of the sixth aspect, the third possible implementation of the sixth aspect, the fourth possible implementation of the sixth aspect, the fifth possible implementation of the sixth aspect, or the sixth possible implementation of the sixth aspect, in a seventh possible implementation of the sixth aspect, the coarse adjustment cell array includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, the coarse adjustment cell i is any coarse adjustment cell in the coarse adjustment cell array, Y is an integer greater than 1, X is an integer greater than 1, and W is an integer greater than 1.

With reference to the seventh possible implementation of the sixth aspect, in an eighth possible implementation of the sixth aspect, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work, where the first value, the second value, and the third value are different from each other.

With reference to the eighth possible implementation of the sixth aspect, in a ninth possible implementation of the sixth aspect, there is a one-to-one correspondence between the W fine adjustment cells in the coarse adjustment cell i and the W fine adjustment control bits input to the logic cell of the coarse adjustment cell i; and if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

With reference to the seventh possible implementation of the sixth aspect, the eighth possible implementation of the sixth aspect, or the ninth possible implementation of the sixth aspect, in a tenth possible implementation of the sixth aspect, W is equal to $2^n$, and n is a positive integer.

With reference to the seventh possible implementation of the sixth aspect, the eighth possible implementation of the sixth aspect, the ninth possible implementation of the sixth aspect, or the tenth possible implementation of the sixth aspect, in an eleventh possible implementation of the sixth aspect, Y is equal to 2.

A seventh aspect of the embodiments of the present disclosure provides an electronic device, including a coarse adjustment cell array, where the coarse adjustment cell array includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, the coarse adjustment cell i is any coarse adjustment cell in the coarse adjustment cell array, Y is an integer greater than 1, X is an integer greater than 1, and W is an integer greater than 1.

With reference to the seventh aspect, in a first possible implementation of the seventh aspect, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work, where the first value, the second value, and the third value are different from each other.

With reference to the first possible implementation of the seventh aspect, in a second possible implementation of the seventh aspect, there is a one-to-one correspondence between the W fine adjustment cells in the coarse adjustment cell i and the W fine adjustment control bits input to the logic cell of the coarse adjustment cell i; and if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

With reference to the seventh aspect, the first possible implementation of the seventh aspect, or the second possible implementation of the seventh aspect, in a third possible implementation of the seventh aspect, W is equal to $2^n$, and n is a positive integer.

With reference to the seventh aspect, the first possible implementation of the seventh aspect, the second possible implementation of the seventh aspect, or the third possible implementation of the seventh aspect, in a fourth possible implementation of the seventh aspect, Y is equal to 2.

An eighth aspect of the embodiments of the present disclosure provides an electronic device, including a digitally controlled oscillator, where the digitally controlled oscillator includes a coarse adjustment cell array, a coarse adjustment row-column decoder, and a fine adjustment row-column decoder, where the coarse adjustment cell array is any coarse adjustment cell array provided in the embodiments of the present disclosure;

the coarse adjustment row-column decoder is configured to decode an input first control signal, so as to output A coarse adjustment control bits;

the fine adjustment row-column decoder is configured to decode an input second control signal, so as to output B fine adjustment control bits; and a set formed by the Y coarse adjustment control bits is a subset of a set including the A coarse adjustment control bits, and a set including the W fine adjustment control bits is a subset of a set including the B fine adjustment control bits.

With reference to the eighth aspect, in a first possible implementation of the eighth aspect, the set including the W fine adjustment control bits is equal to the set including the B fine adjustment control bits, and each coarse adjustment cell in the coarse adjustment cell array shares the W fine adjustment control bits.

With reference to the eighth aspect or the first possible implementation of the eighth aspect, in a second possible implementation of the eighth aspect, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

With reference to the eighth aspect, the first possible implementation of the eighth aspect, or the eighth possible implementation of the eighth aspect, in a third possible implementation of the eighth aspect, the coarse adjustment row-column decoder includes A coarse adjustment control bit output cables, and the A coarse adjustment control bits are in a one-to-one correspondence with the A coarse adjustment control bit output cables.

With reference to the eighth aspect, the first possible implementation of the eighth aspect, the second possible implementation of the eighth aspect, or the third possible implementation of the eighth aspect, in a fourth possible implementation of the eighth aspect, the fine adjustment row-column decoder includes B fine adjustment control bit output cables, and the B fine adjustment control bits are in a one-to-one correspondence with the B fine adjustment control bit output cables.

With reference to the eighth aspect, the first possible implementation of the eighth aspect, the second possible implementation of the eighth aspect, the third possible implementation of the eighth aspect, or the fourth possible implementation of the eighth aspect, in a fifth possible implementation of the eighth aspect, the coarse adjustment cell array includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, the coarse adjustment cell i is any coarse adjustment cell in the coarse adjustment cell array, Y is an integer greater than 1, X is an integer greater than 1, and W is an integer greater than 1.

With reference to the fifth possible implementation of the eighth aspect, in a sixth possible implementation of the eighth aspect, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work, where the first value, the second value, and the third value are different from each other.

With reference to the sixth possible implementation of the eighth aspect, in a seventh possible implementation of the eighth aspect, there is a one-to-one correspondence between the W fine adjustment cells in the coarse adjustment cell i and the W fine adjustment control bits input to the logic cell of the coarse adjustment cell i; and if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

With reference to the fifth possible implementation of the eighth aspect, the sixth possible implementation of the eighth aspect, or the seventh possible implementation of the eighth aspect, in an eighth possible implementation of the eighth aspect, W is equal to $2^n$, and n is a positive integer.

With reference to the fifth possible implementation of the eighth aspect, the sixth possible implementation of the eighth aspect, the seventh possible implementation of the eighth aspect, or the eighth possible implementation of the eighth aspect, in a ninth possible implementation of the eighth aspect, Y is equal to 2.

A ninth aspect of the embodiments of the present disclosure provides an electronic device, including a frequency synthesizer, where the frequency synthesizer includes:

a digitally controlled oscillator and a digital logic cell, where the digitally controlled oscillator is any digitally controlled oscillator provided in the embodiments of the present disclosure, the digital logic cell is configured to output the first control signal to the coarse adjustment row-column decoder, and the digital logic cell is further configured to output the second control signal to the fine adjustment row-column decoder.

With reference to the ninth aspect, in a first possible implementation of the ninth aspect, the digital logic cell is configured to output the first control signal to the coarse adjustment row-column decoder according to a frequency dividing control word and a reference frequency that are input to the digital logic cell, and the digital logic cell is further configured to output the second control signal to the fine adjustment row-column decoder according to the frequency dividing control word and the reference frequency that are input to the digital logic cell.

With reference to the ninth aspect or the first possible implementation of the ninth aspect, in a second possible implementation of the ninth aspect, the digitally controlled oscillator includes a coarse adjustment cell array, a coarse adjustment row-column decoder, and a fine adjustment row-column decoder, where the coarse adjustment cell array is any coarse adjustment cell array provided in the embodiments of the present disclosure;

the coarse adjustment row-column decoder is configured to decode an input first control signal, so as to output A coarse adjustment control bits;

the fine adjustment row-column decoder is configured to decode an input second control signal, so as to output B fine adjustment control bits; and a set formed by the Y coarse adjustment control bits is a subset of a set including the A coarse adjustment control bits, and a set including the W fine adjustment control bits is a subset of a set including the B fine adjustment control bits.

With reference to the second possible implementation of the ninth aspect, in a third possible implementation of the ninth aspect, the set including the W fine adjustment control bits is equal to the set including the B fine adjustment control bits, and each coarse adjustment cell in the coarse adjustment cell array shares the W fine adjustment control bits.

With reference to the second possible implementation of the ninth aspect or the third possible implementation of the ninth aspect, in a fourth possible implementation of the ninth aspect, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

With reference to the second possible implementation of the ninth aspect, the third possible implementation of the ninth aspect, or the fourth possible implementation of the ninth aspect, in a fifth possible implementation of the ninth aspect, the coarse adjustment row-column decoder includes A coarse adjustment control bit output cables, and the A coarse adjustment control bits are in a one-to-one correspondence with the A coarse adjustment control bit output cables.

With reference to the second possible implementation of the ninth aspect, the third possible implementation of the ninth aspect, the fourth possible implementation of the ninth aspect, or the fifth possible implementation of the ninth aspect, in a sixth possible implementation of the ninth aspect, the fine adjustment row-column decoder includes B fine adjustment control bit output cables, and the B fine adjustment control bits are in a one-to-one correspondence with the B fine adjustment control bit output cables.

With reference to the second possible implementation of the ninth aspect, the third possible implementation of the ninth aspect, the fourth possible implementation of the ninth aspect, the fifth possible implementation of the ninth aspect, or the sixth possible implementation of the ninth aspect, in a seventh possible implementation of the ninth aspect, the coarse adjustment cell array includes X coarse adjustment cells, and each coarse adjustment cell in the coarse adjustment cell array includes a logic cell and W fine adjustment cells; and input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, the coarse adjustment cell i is any coarse adjustment cell in the coarse adjustment cell array, Y is an integer greater than 1, X is an integer greater than 1, and W is an integer greater than 1.

With reference to the seventh possible implementation of the ninth aspect, in an eighth possible implementation of the ninth aspect, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work, where the first value, the second value, and the third value are different from each other.

With reference to the eighth possible implementation of the ninth aspect, in a ninth possible implementation of the ninth aspect, there is a one-to-one correspondence between the W fine adjustment cells in the coarse adjustment cell i and the W fine adjustment control bits input to the logic cell of the coarse adjustment cell i; and if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

With reference to the seventh possible implementation of the ninth aspect, the eighth possible implementation of the ninth aspect, or the ninth possible implementation of the ninth aspect, in a tenth possible implementation of the ninth aspect, W is equal to $2^n$, and n is a positive integer.

With reference to the seventh possible implementation of the ninth aspect, the eighth possible implementation of the ninth aspect, the ninth possible implementation of the ninth aspect, or the tenth possible implementation of the ninth aspect, in an eleventh possible implementation of the ninth aspect, Y is equal to 2.

It can be learned that a coarse adjustment cell array of a digitally controlled oscillator provided in the embodiments of the present disclosure includes X coarse adjustment cells. Each coarse adjustment cell in the coarse adjustment cell array includes a logic cell and W fine adjustment cells, that is, a fine adjustment cell is nested in a coarse adjustment cell, so that a frequency step of a coarse adjustment cell is directly determined by using frequency steps of all fine adjustment cells in the coarse adjustment cell, and the frequency step of the coarse adjustment cell can be better matched to the frequency steps of the fine adjustment cells. This helps avoid a mismatch problem in the conventional art that occurs during carry from a fine adjustment cell to a coarse adjustment cell. In addition, a logic cell is introduced to each coarse adjustment cell, to control a working status (the working status may be working or not working) of each fine adjustment cell in the coarse adjustment cell, so that each coarse adjustment cell can be flexibly and independently controlled to work. This helps alleviate mismatch pressure in a circuit and layout design process. The introduction of the logic cell also helps reduce a quantity of control cables, and helps reduce complexity of a cabling layout of a related circuit, reduce complexity and an area of the circuit, and simplify a structure of the circuit.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DESCRIPTION OF EMBODIMENTS

Figure 1:
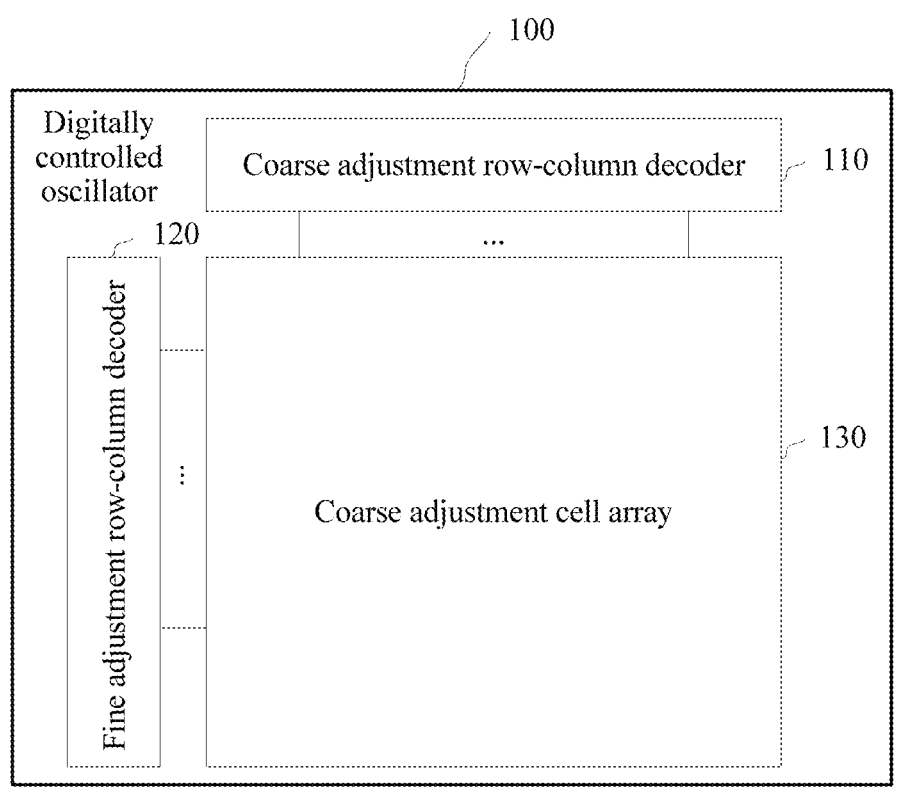
FIG. 1 is a schematic architecture diagram of a digitally controlled oscillator according to an embodiment of the present disclosure.

Embodiments of the present disclosure provide a coarse adjustment cell array applied to a digitally controlled oscillator and a related apparatus, to avoid a mismatch problem as far as possible, so as to improve related circuit performance.

To make persons skilled in the art understand the technical solutions in the present disclosure better, the following clearly describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by persons of ordinary skill in the art based on the embodiments of the present disclosure without creative efforts shall fall within the protection scope of the present disclosure.

In the specification, claims, and accompanying drawings of the present disclosure, the terms "first", "second", "third", and the like are intended to distinguish between different objects but do not indicate a particular order. In addition, the terms "including", "having", or any other variant thereof, are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

A capacitor array of a conventional DCO includes a fine adjustment cell array and a coarse adjustment cell array. The fine adjustment cell array is independent of the coarse adjustment cell array and there is no nested relationship between the two. The following describes a generation mechanism of a mismatch problem in detail by using an example.

For example, an ideal design is that a frequency step of a fine adjustment cell may be 10 ppm. If a fine adjustment cell array includes seven fine adjustment cells in total, a total frequency step is 70 ppm, and a frequency step of each coarse adjustment cell in a coarse adjustment cell array is 80 ppm, a frequency step of carry from a fine adjustment cell to a coarse adjustment cell is 10 ppm (80 ppm-7×10 ppm=10 ppm). However, a mismatch problem usually occurs in an actual circuit. If a test result of the frequency step of the fine adjustment cell is 8 ppm, instead of 10 ppm in the ideal design, and the frequency step of the coarse adjustment cell is still 80 ppm, a frequency step of carry from the fine adjustment cell array to the coarse adjustment cell is 24 ppm. Therefore, overall frequency steps of a capacitor array may be . . . -8 ppm-8 ppm-8 ppm-8 ppm-8 ppm-8 ppm-24 ppm- . . . , that is, after every seven times of 8 ppm, there is a larger frequency step of 24 ppm. Occurrence of this larger frequency step may greatly affect circuit performance.

The following describes solutions in the embodiments of the present disclosure in detail.

An embodiment of the present disclosure provides a digitally controlled oscillator, and the digitally controlled oscillator may include a coarse adjustment cell array, a coarse adjustment row-column decoder, and a fine adjustment row-column decoder. The coarse adjustment cell array may include X coarse adjustment cells, and each coarse adjustment cell in the coarse adjustment cell array may include a logic cell and W fine adjustment cells.

Input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, and the coarse adjustment cell i is any coarse adjustment cell in the coarse adjustment cell array. Y is an integer greater than 1, X is an integer greater than 1, and W is an integer greater than 1.

For example, Y may be equal to 17, 2, 3, 4, 5, 6, 8, 10, 15, 19, 21, 30, 50, or another value.

For example, X may be equal to 17, 2, 3, 4, 5, 6, 8, 12, 15, 19, 21, 30, 51, or another value.

For example, W may be equal to 17, 2, 3, 4, 5, 6, 8, 12, 16, 19, 21, 32, 50, or another value.

In some possible implementations of the present disclosure, W may be equal to $2^n$, and n may be a positive integer.

For example, n may be equal to 1, 2, 3, 4, 5, 6, 8, 12, 15, 19, 21, 30, 50, or another value.

Referring to FIG. 1, FIG. 1 is a schematic diagram of a digitally controlled oscillator according to an embodiment of the present disclosure. A digitally controlled oscillator 100 whose architecture is shown in FIG. 1 may include a coarse adjustment cell array 130, a coarse adjustment row-column decoder 110, and a fine adjustment row-column decoder 120.

Figure 2:
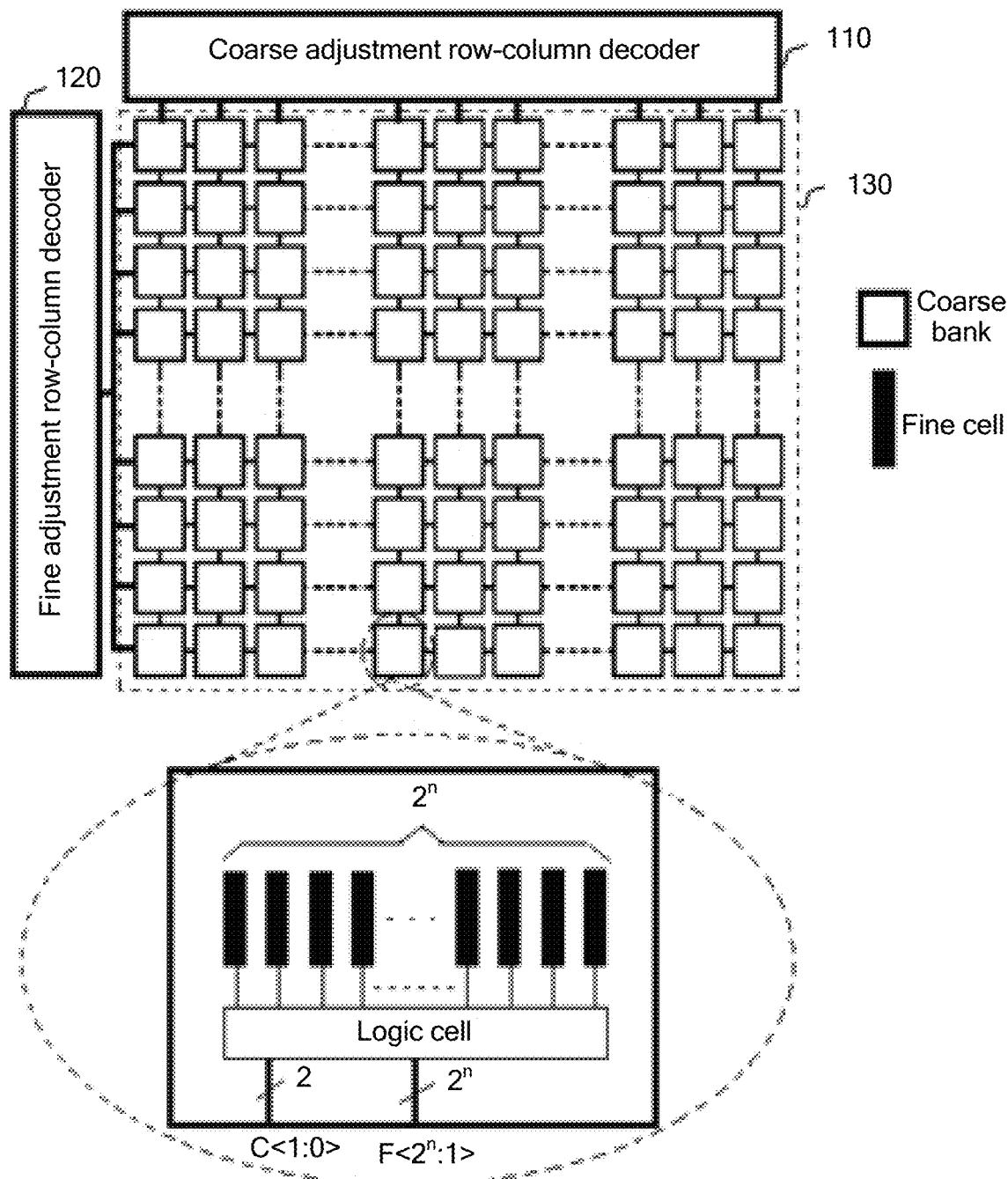
FIG. 2 is a schematic architecture diagram of another digitally controlled oscillator according to an embodiment of the present disclosure.

Referring to FIG. 2, FIG. 2 is a schematic diagram of a possible internal architecture of the digitally controlled oscillator 100 according to an embodiment of the present disclosure. In the digitally controlled oscillator 100 whose architecture is shown in FIG. 2, each coarse adjustment cell in the coarse adjustment cell array 130 may include a logic cell and $2^n$ fine adjustment cells. That is, for example, W is equal to $2^n$ in FIG. 2. For example, Y is equal to 2 in FIG. 2, and two coarse adjustment control bits may be represented as C<1:0>. If W is equal to $2^n$, $2^n$ fine adjustment control bits may be represented as F<$2^n$:1>.

Similarly, A coarse adjustment control bits may be represented as C<A−1:0>.

Similarly, B fine adjustment control bits may be represented as F<B−1:0>.

Similarly, W fine adjustment control bits may be represented as F<W−1:0>.

The coarse adjustment row-column decoder is configured to decode a first control signal input to the coarse adjustment row-column decoder, so as to output A coarse adjustment control bits.

For example, A may be equal to 17, 2, 3, 4, 5, 6, 8, 10, 15, 19, 21, 30, 50, or another value.

A is greater than or equal to X.

In some possible implementations of the present disclosure, A may be equal to X+1.

The fine adjustment row-column decoder is configured to decode a second control signal input to the fine adjustment row-column decoder, so as to output B fine adjustment control bits.

For example, B may be equal to 16, 2, 3, 4, 5, 6, 8, 10, 15, 19, 21, 30, 50, or another value.

A set formed by the Y coarse adjustment control bits is a subset of a set including the A coarse adjustment control bits. Specifically, for example, the Y coarse adjustment control bits may be some or all coarse adjustment control bits in the A coarse adjustment control bits.

A set including the W fine adjustment control bits is a subset of a set including the B fine adjustment control bits. Specifically, for example, the W fine adjustment control bits may be some or all fine adjustment control bits in the B fine adjustment control bits.

A value of each coarse adjustment control bit may be "0" or "1", and a value of each fine adjustment control bit may be "0" or "1".

Frequency steps of the W fine adjustment cells in the coarse adjustment cell i may be all equal, or partially equal, or not equal to each other.

Frequency steps of the X coarse adjustment cells may be all equal, or partially equal, or not equal to each other.

It can be learned that a coarse adjustment cell array of a digitally controlled oscillator in this embodiment includes X coarse adjustment cells. Each coarse adjustment cell in the coarse adjustment cell array includes a logic cell and W fine adjustment cells, that is, a fine adjustment cell is nested in a coarse adjustment cell, so that a frequency step of a coarse adjustment cell is directly determined by using frequency steps of all fine adjustment cells in the coarse adjustment cell, and the frequency step of the coarse adjustment cell can be better matched to the frequency steps of the fine adjustment cells. This helps avoid a mismatch problem in the conventional art that occurs during carry from a fine adjustment cell to a coarse adjustment cell. In addition, a logic cell is introduced to each coarse adjustment cell, to control a working status (the working status may be working or not working) of each fine adjustment cell in the coarse adjustment cell, so that each coarse adjustment cell can be flexibly and independently controlled to work. This helps alleviate mismatch pressure in a circuit and layout design process.

The introduction of the logic cell also helps reduce a quantity of control cables, and helps reduce complexity of a cabling layout of a related circuit, reduce complexity and an area of the circuit, and simplify a structure of the circuit.

Optionally, in some possible implementations of the present disclosure, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work. The first value, the second value, and the third value are different from each other.

It can be understood that, in the foregoing implementation example, if the Y coarse adjustment control bits input to the logic cell of the coarse adjustment cell i are the first value, the logic cell of the coarse adjustment cell i controls, regardless of the value of the W fine adjustment control bits input to the logic cell of the coarse adjustment cell i, all the W fine adjustment cells in the coarse adjustment cell i to work, that is, the W fine adjustment control bits input to the logic cell of the coarse adjustment cell i are considered to be invalid in this case.

It can be understood that, in the foregoing implementation example, if the Y coarse adjustment control bits input to the logic cell of the coarse adjustment cell i are the second value, the logic cell of the coarse adjustment cell i controls, regardless of the value of the W fine adjustment control bits input to the logic cell of the coarse adjustment cell i, all the W fine adjustment cells in the coarse adjustment cell i not to work, that is, the W fine adjustment control bits input to the logic cell of the coarse adjustment cell i are considered to be invalid in this case.

It can be understood that, in the foregoing implementation example, if the Y coarse adjustment control bits input to the logic cell of the coarse adjustment cell i are the third value, the logic cell of the coarse adjustment cell i controls, based on the value of the W fine adjustment control bits, some of the W fine adjustment cells in the coarse adjustment cell i to work, that is, the W fine adjustment control bits input to the logic cell of the coarse adjustment cell i are considered to be valid in this case.

For example, if Y is equal to 2, the first value may be "00", "11", "01", or "10". The second value may be any value that is in the foregoing four possible values and that is different from the first value. The third value may be any value that is in the foregoing four possible values and that is different from the first value and the second value. Specifically, for example, the first value may be "11", the second value may be "00", and the third value may be "01" or "10". The values may be analogized if Y is equal to another value.

Optionally, in some possible implementations of the present disclosure, there is a one-to-one correspondence between the W fine adjustment cells in the coarse adjustment cell i and the W fine adjustment control bits input to the logic cell of the coarse adjustment cell i. If the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work (that is, the fine adjustment cell is disabled); or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

Optionally, in some possible implementations of the present disclosure, the set including the W fine adjustment control bits is equal to the set including the B fine adjustment control bits (that is, W is equal to B). Each coarse adjustment cell in the coarse adjustment cell array shares the W fine adjustment control bits.

Optionally, in some possible implementations of the present disclosure, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

Figure 3:
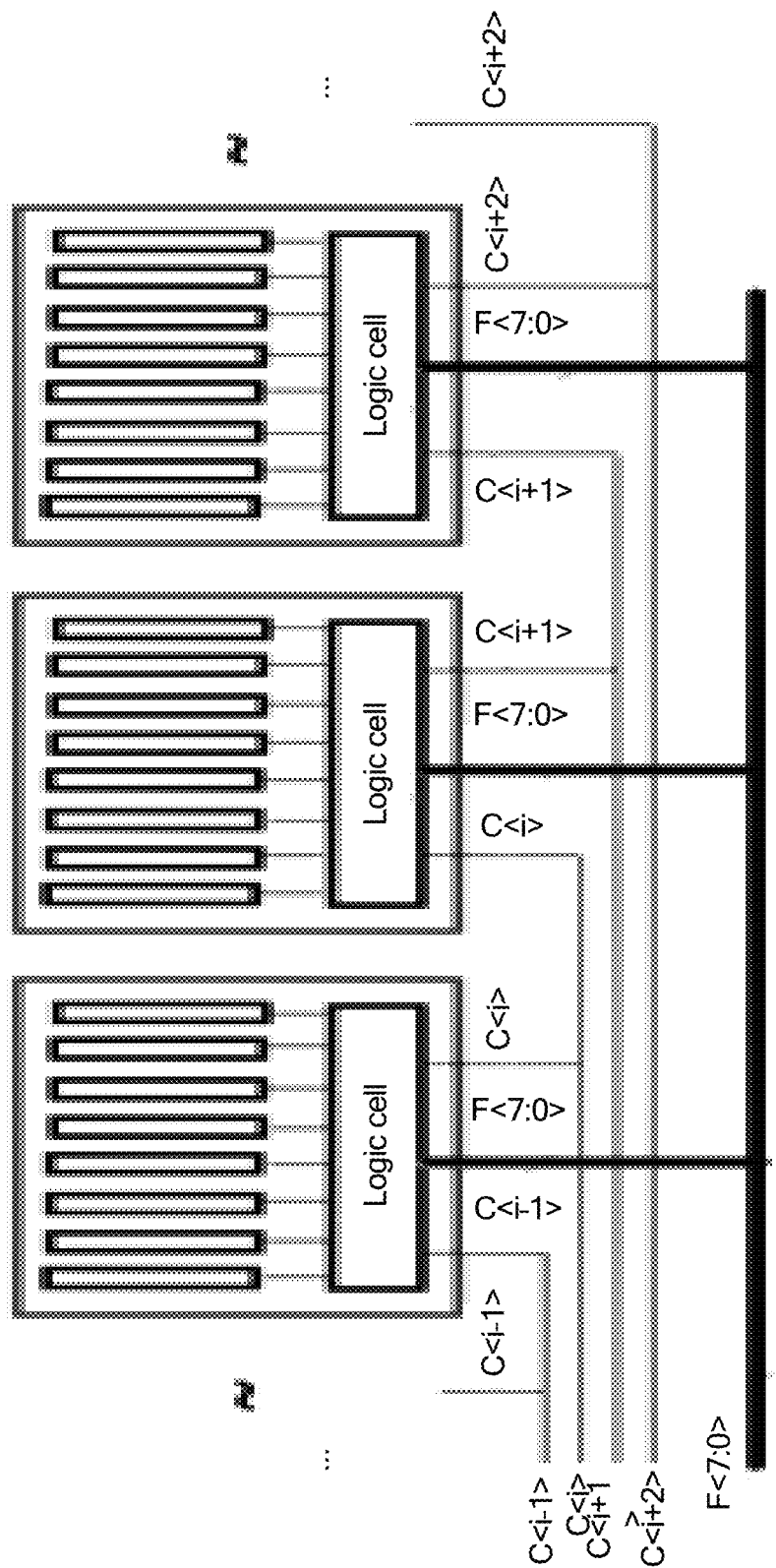
FIG. 3 is a schematic architecture diagram of internal cabling of a coarse adjustment cell array according to an embodiment of the present disclosure.

Referring to FIG. 3, FIG. 3 is a schematic diagram of a possible internal cabling manner of the coarse adjustment cell array 130 according to an embodiment of the present disclosure. Each coarse adjustment cell may include $2^n$ fine adjustment cells. In an example in FIG. 3, n=3, and each coarse adjustment cell includes one logic cell and eight fine adjustment cells. Input to the logic cell includes two adjacent coarse adjustment control bits and $2^n$ fine adjustment control bits. If n=3, the fine adjustment control bits are represented as F<7:0>. Output from the logic cell is used to control the $2^n$ fine adjustment cells to work. In an architecture illustrated in FIG. 3, each coarse adjustment cell in the coarse adjustment cell array shares the $2^n$ fine adjustment control bits.

Optionally, in some possible implementations of the present disclosure, the coarse adjustment row-column decoder includes A coarse adjustment control bit output cables, and the A coarse adjustment control bits are in a one-to-one correspondence with the A coarse adjustment control bit output cables. That is, coarse adjustment control bits in the A coarse adjustment control bits are output by using different coarse adjustment control bit output cables in the A coarse adjustment control bit output cables.

Optionally, in some possible implementations of the present disclosure, the fine adjustment row-column decoder includes B fine adjustment control bit output cables, and the B fine adjustment control bits are in a one-to-one correspondence with the B fine adjustment control bit output cables. That is, fine adjustment control bits in the B fine adjustment control bits are output by using different fine adjustment control bit output cables in the B fine adjustment control bit output cables.

An embodiment of the present disclosure provides a coarse adjustment cell array applied to a digitally controlled oscillator. The coarse adjustment cell array includes X coarse adjustment cells, and each coarse adjustment cell in the coarse adjustment cell array includes a logic cell and W fine adjustment cells. Input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, and the coarse adjustment cell i is any coarse adjustment cell in the coarse adjustment cell array. Y is an integer greater than 1, X is an integer greater than 1, and W is an integer greater than 1.

For example, Y may be equal to 17, 2, 3, 4, 5, 6, 8, 10, 15, 19, 21, 30, 50, or another value.

For example, X may be equal to 17, 2, 3, 4, 5, 6, 8, 12, 15, 19, 21, 30, 51, or another value.

For example, W may be equal to 17, 2, 3, 4, 5, 6, 8, 12, 16, 19, 21, 32, 50, or another value.

In some possible implementations of the present disclosure, W may be equal to $2^n$, and n may be a positive integer.

For example, n may be equal to 1, 2, 3, 4, 5, 6, 8, 12, 15, 19, 21, 30, 50, or another value.

A coarse adjustment row-column decoder is configured to decode a first control signal input to the coarse adjustment row-column decoder, so as to output A coarse adjustment control bits.

In some possible implementations of the present disclosure, A may be equal to X+1.

For example, A may be equal to 17, 2, 3, 4, 5, 6, 8, 10, 15, 19, 21, 30, 50, or another value.

A fine adjustment row-column decoder is configured to decode a second control signal input to the fine adjustment row-column decoder, so as to output B fine adjustment control bits.

For example, B may be equal to 16, 2, 3, 4, 5, 6, 8, 10, 15, 19, 21, 30, 50, or another value.

A set formed by the Y coarse adjustment control bits is a subset of a set including the A coarse adjustment control bits. Specifically, for example, the Y coarse adjustment control bits may be some or all coarse adjustment control bits in the A coarse adjustment control bits.

A set including the W fine adjustment control bits is a subset of a set including the B fine adjustment control bits. Specifically, for example, the W fine adjustment control bits may be some or all fine adjustment control bits in the B fine adjustment control bits.

A value of each coarse adjustment control bit may be "0" or "1", and a value of each fine adjustment control bit may be "0" or "1".

Frequency steps of the W fine adjustment cells in the coarse adjustment cell i may be all equal, or partially equal, or not equal to each other.

Frequency steps of the X coarse adjustment cells may be all equal, or partially equal, or not equal to each other.

It can be learned that a coarse adjustment cell array applied to a digitally controlled oscillator in this embodiment may include X coarse adjustment cells. Each coarse adjustment cell in the coarse adjustment cell array includes a logic cell and W fine adjustment cells, that is, a fine adjustment cell is nested in a coarse adjustment cell, so that a frequency step of a coarse adjustment cell is directly determined by using frequency steps of all fine adjustment cells in the coarse adjustment cell, and the frequency step of the coarse adjustment cell can be better matched to the frequency steps of the fine adjustment cells. This helps avoid a mismatch problem in the conventional art that occurs during carry from a fine adjustment cell to a coarse adjustment cell. In addition, a logic cell is introduced to each coarse adjustment cell, to control a working status (the working status may be working or not working) of each fine adjustment cell in the coarse adjustment cell, so that each coarse adjustment cell can be flexibly and independently controlled to work. This helps alleviate mismatch pressure in a circuit and layout design process. The introduction of the logic cell also helps reduce a quantity of control cables, and helps reduce complexity of a cabling layout of a related circuit, reduce complexity and an area of the circuit, and simplify a structure of the circuit.

Optionally, in some possible implementations of the present disclosure, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work. The first value, the second value, and the third value are different from each other.

It can be understood that, in the foregoing implementation example, if the Y coarse adjustment control bits input to the logic cell of the coarse adjustment cell i are the first value, the logic cell of the coarse adjustment cell i controls, regardless of the value of the W fine adjustment control bits input to the logic cell of the coarse adjustment cell i, all the W fine adjustment cells in the coarse adjustment cell i to work, that is, the W fine adjustment control bits input to the logic cell of the coarse adjustment cell i are considered to be invalid in this case.

It can be understood that, in the foregoing implementation example, if the Y coarse adjustment control bits input to the logic cell of the coarse adjustment cell i are the second value, the logic cell of the coarse adjustment cell i controls, regardless of the value of the W fine adjustment control bits input to the logic cell of the coarse adjustment cell i, all the W fine adjustment cells in the coarse adjustment cell i not to work, that is, the W fine adjustment control bits input to the logic cell of the coarse adjustment cell i are considered to be invalid in this case.

It can be understood that, in the foregoing implementation example, if the Y coarse adjustment control bits input to the logic cell of the coarse adjustment cell i are the third value, the logic cell of the coarse adjustment cell i controls, based on the value of the W fine adjustment control bits, some of the W fine adjustment cells in the coarse adjustment cell i to work, that is, the W fine adjustment control bits input to the logic cell of the coarse adjustment cell i are considered to be valid in this case.

For example, if Y is equal to 2, the first value may be "00", "11", "01", or "10". The second value may be any value that is in the foregoing four possible values and that is different from the first value. The third value may be any value that is in the foregoing four possible values and that is different from the first value and the second value. Specifically, for example, the first value may be "11", the second value may be "00", and the third value may be "01" or "10". The values may be analogized if Y is equal to another value.

Optionally, in some possible implementations of the present disclosure, there is a one-to-one correspondence between the W fine adjustment cells in the coarse adjustment cell i and the W fine adjustment control bits input to the logic cell of the coarse adjustment cell i. If the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

Optionally, in some possible implementations of the present disclosure, the set including the W fine adjustment control bits is equal to the set including the B fine adjustment control bits, and each coarse adjustment cell in the coarse adjustment cell array shares the W fine adjustment control bits.

Optionally, in some possible implementations of the present disclosure, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

Figure 4:
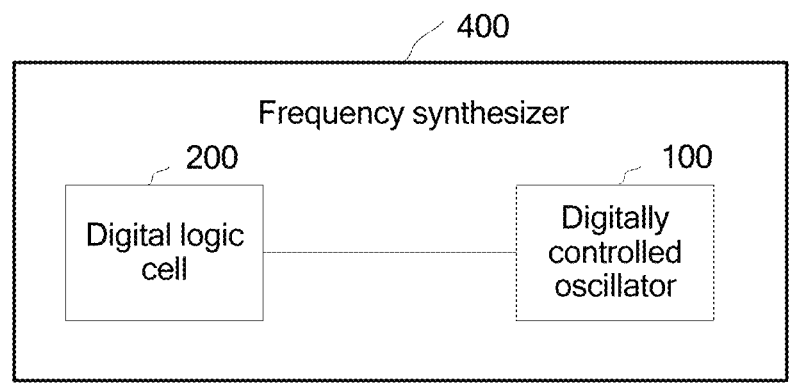
FIG. 4 is a schematic architecture diagram of a frequency synthesizer according to an embodiment of the present disclosure.

Referring to FIG. 4, an embodiment of the present disclosure provides a frequency synthesizer 400, including:

a digitally controlled oscillator 100 and a digital logic cell 200, where the digitally controlled oscillator 100 is any digitally controlled oscillator in the foregoing embodiments, the digital logic cell 200 is configured to output the first control signal to the coarse adjustment row-column decoder, and the digital logic cell 200 is further configured to output the second control signal to the fine adjustment row-column decoder.

Optionally, in some possible implementations of the present disclosure, the digital logic cell is configured to output the first control signal to the coarse adjustment row-column decoder according to a frequency dividing control word and a reference frequency that are input to the digital logic cell, and the digital logic cell is further configured to output the second control signal to the fine adjustment row-column decoder according to the frequency dividing control word and the reference frequency that are input to the digital logic cell.

Figure 5:
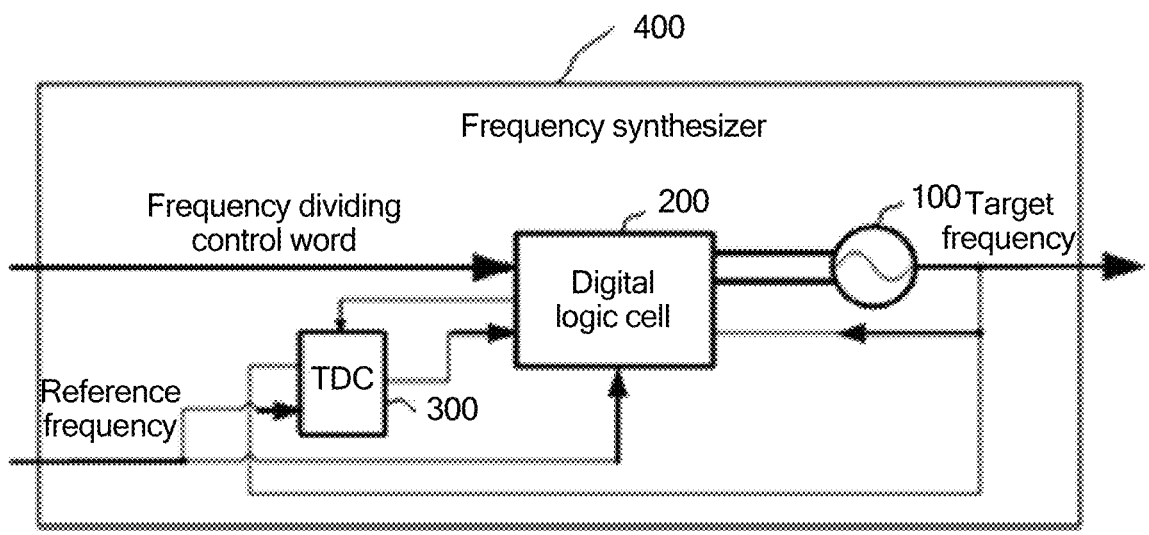
FIG. 5 is a schematic architecture diagram of another frequency synthesizer according to an embodiment of the present disclosure.

Referring to FIG. 5, FIG. 5 is a schematic diagram of a possible specific structure of the frequency synthesizer 400 according to an embodiment of the present disclosure. The frequency synthesizer 400 may further include a time-to-digital converter 300 (TDC), and the time-to-digital converter 300 outputs a signal to the digital logic cell 200.

Figure 6:
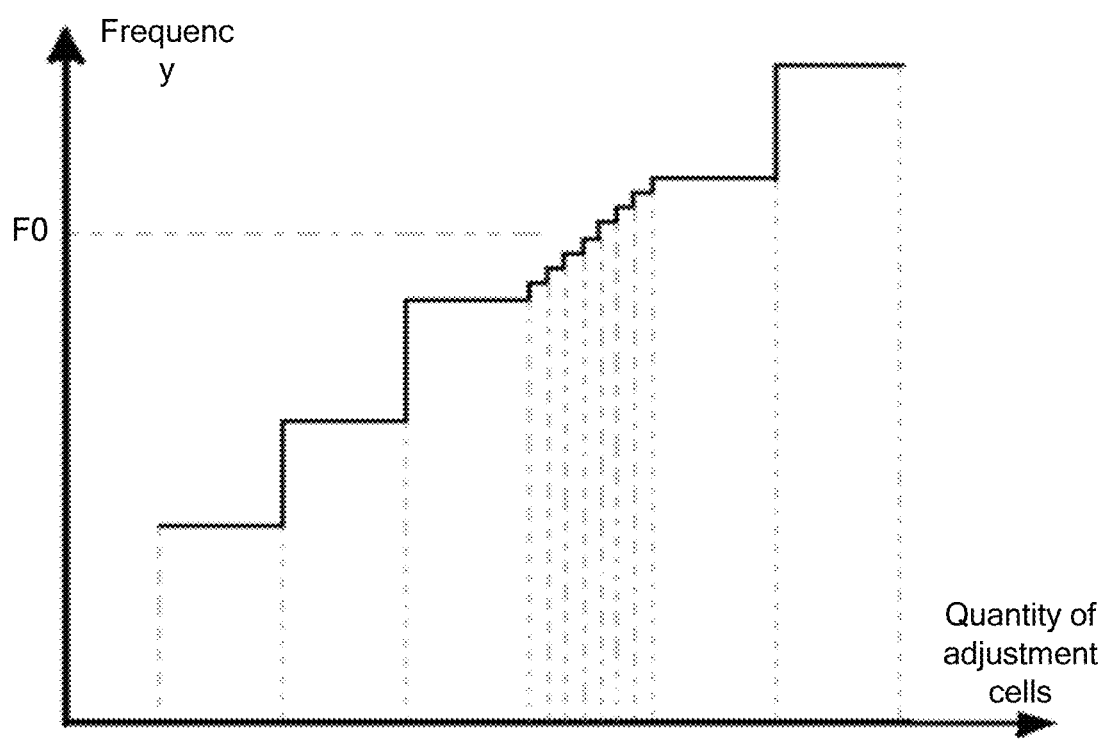
FIG. 6 is a schematic diagram of a relationship between a frequency and a quantity of adjustment cells according to an embodiment of the present disclosure.

When the frequency synthesizer (such as a phase-locked loop) is not locked, there is a relatively large difference between a frequency of the digitally controlled oscillator and a target frequency. In this case, a coarse adjustment control bit is mainly depended on to make the oscillation frequency approximate to the target frequency. When the difference between the oscillation frequency and the target frequency is less than a frequency step of a coarse adjustment cell, a fine adjustment cell is mainly depended on to dynamically correct the frequency in a real-time manner. An example in FIG. 6 shows a relationship between a frequency and a quantity of working adjustment cells (the adjustment cells include a coarse adjustment cell and a fine adjustment cell). F0 represents the target frequency.

A circuit provided in an embodiment of the present disclosure may include any coarse adjustment cell array provided in the embodiments of the present disclosure.

For example, the coarse adjustment cell array includes X coarse adjustment cells, and each coarse adjustment cell in the coarse adjustment cell array includes a logic cell and W fine adjustment cells. Input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, and the coarse adjustment cell i is any coarse adjustment cell in the coarse adjustment cell array. Y is an integer greater than 1, X is an integer greater than 1, and W is an integer greater than 1.

For example, Y may be equal to 17, 2, 3, 4, 5, 6, 8, 10, 15, 19, 21, 30, 50, or another value.

For example, X may be equal to 17, 2, 3, 4, 5, 6, 8, 12, 15, 19, 21, 30, 51, or another value.

For example, W may be equal to 17, 2, 3, 4, 5, 6, 8, 12, 16, 19, 21, 32, 50, or another value.

In some possible implementations of the present disclosure, W may be equal to $2^n$, and n may be a positive integer.

For example, n may be equal to 1, 2, 3, 4, 5, 6, 8, 12, 15, 19, 21, 30, 50, or another value.

A coarse adjustment row-column decoder is configured to decode a first control signal input to the coarse adjustment row-column decoder, so as to output A coarse adjustment control bits.

In some possible implementations of the present disclosure, A may be equal to X+1.

For example, A may be equal to 17, 2, 3, 4, 5, 6, 8, 10, 15, 19, 21, 30, 50, or another value.

A fine adjustment row-column decoder is configured to decode a second control signal input to the fine adjustment row-column decoder, so as to output B fine adjustment control bits.

For example, B may be equal to 16, 2, 3, 4, 5, 6, 8, 10, 15, 19, 21, 30, 50, or another value.

A set including the Y coarse adjustment control bits is a subset of a set formed by the A coarse adjustment control bits. Specifically, for example, the Y coarse adjustment control bits may be some or all coarse adjustment control bits in the A coarse adjustment control bits.

A set including the W fine adjustment control bits is a subset of a set including the B fine adjustment control bits. Specifically, for example, the W fine adjustment control bits may be some or all fine adjustment control bits in the B fine adjustment control bits.

A value of each coarse adjustment control bit may be "0" or "1", and a value of each fine adjustment control bit may be "0" or "1".

Frequency steps of the W fine adjustment cells in the coarse adjustment cell i may be all equal, or partially equal, or not equal to each other.

Frequency steps of the X coarse adjustment cells may be all equal, or partially equal, or not equal to each other.

Optionally, in some possible implementations of the present disclosure, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work. The first value, the second value, and the third value are different from each other.

It can be understood that, in the foregoing implementation example, if the Y coarse adjustment control bits input to the logic cell of the coarse adjustment cell i are the first value, the logic cell of the coarse adjustment cell i controls, regardless of the value of the W fine adjustment control bits input to the logic cell of the coarse adjustment cell i, all the W fine adjustment cells in the coarse adjustment cell i to work, that is, the W fine adjustment control bits input to the logic cell of the coarse adjustment cell i are considered to be invalid in this case.

It can be understood that, in the foregoing implementation example, if the Y coarse adjustment control bits input to the logic cell of the coarse adjustment cell i are the second value, the logic cell of the coarse adjustment cell i controls, regardless of the value of the W fine adjustment control bits input to the logic cell of the coarse adjustment cell i, all the W fine adjustment cells in the coarse adjustment cell i not to work, that is, the W fine adjustment control bits input to the logic cell of the coarse adjustment cell i are considered to be invalid in this case.

It can be understood that, in the foregoing implementation example, if the Y coarse adjustment control bits input to the logic cell of the coarse adjustment cell i are the third value, the logic cell of the coarse adjustment cell i controls, based on the value of the W fine adjustment control bits, some of the W fine adjustment cells in the coarse adjustment cell i to work, that is, the W fine adjustment control bits input to the logic cell of the coarse adjustment cell i are considered to be valid in this case.

For example, if Y is equal to 2, the first value may be "00", "11", "01", or "10". The second value may be any value that is in the foregoing four possible values and that is different from the first value. The third value may be any value that is in the foregoing four possible values and that is different from the first value and the second value. Specifically, for example, the first value may be "11", the second value may be "00", and the third value may be "01" or "10". The values may be analogized if Y is equal to another value.

Optionally, in some possible implementations of the present disclosure, there is a one-to-one correspondence between the W fine adjustment cells in the coarse adjustment cell i and the W fine adjustment control bits input to the logic cell of the coarse adjustment cell i. If the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work; or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

Optionally, in some possible implementations of the present disclosure, the set including the W fine adjustment control bits is equal to the set including the B fine adjustment control bits, and each coarse adjustment cell in the coarse adjustment cell array shares the W fine adjustment control bits.

Optionally, in some possible implementations of the present disclosure, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

A circuit provided in an embodiment of the present disclosure may include any digitally controlled oscillator provided in the embodiments of the present disclosure. For example, the digitally controlled oscillator may include a coarse adjustment cell array, a coarse adjustment row-column decoder, and a fine adjustment row-column decoder. The coarse adjustment cell array may include X coarse adjustment cells, and each coarse adjustment cell in the coarse adjustment cell array may include a logic cell (Logic Cell) and W fine adjustment cells.

Input to a logic cell of a coarse adjustment cell i in the coarse adjustment cell array includes Y coarse adjustment control bits and W fine adjustment control bits, output from the logic cell of the coarse adjustment cell i is used to control whether W fine adjustment cells in the coarse adjustment cell i work, and the coarse adjustment cell i is any coarse adjustment cell in the coarse adjustment cell array. Y is an integer greater than 1, X is an integer greater than 1, and W is an integer greater than 1.

For example, Y may be equal to 17, 2, 3, 4, 5, 6, 8, 10, 15, 19, 21, 30, 50, or another value.

For example, X may be equal to 17, 2, 3, 4, 5, 6, 8, 12, 15, 19, 21, 30, 51, or another value.

For example, W may be equal to 17, 2, 3, 4, 5, 6, 8, 12, 16, 19, 21, 32, 50, or another value.

In some possible implementations of the present disclosure, W may be equal to $2^n$, and n may be a positive integer.

For example, n may be equal to 1, 2, 3, 4, 5, 6, 8, 12, 15, 19, 21, 30, 50, or another value.

The coarse adjustment row-column decoder is configured to decode a first control signal input to the coarse adjustment row-column decoder, so as to output A coarse adjustment control bits.

For example, A may be equal to 17, 2, 3, 4, 5, 6, 8, 10, 15, 19, 21, 30, 50, or another value.

A is greater than or equal to X.

In some possible implementations of the present disclosure, A may be equal to X+1.

The fine adjustment row-column decoder is configured to decode a second control signal input to the fine adjustment row-column decoder, so as to output B fine adjustment control bits.

For example, B may be equal to 16, 2, 3, 4, 5, 6, 8, 10, 15, 19, 21, 30, 50, or another value.

A set including the Y coarse adjustment control bits is a subset of a set formed by the A coarse adjustment control bits. Specifically, for example, the Y coarse adjustment control bits may be some or all coarse adjustment control bits in the A coarse adjustment control bits.

A set including the W fine adjustment control bits is a subset of a set including the B fine adjustment control bits. Specifically, for example, the W fine adjustment control bits may be some or all fine adjustment control bits in the B fine adjustment control bits.

A value of each coarse adjustment control bit may be "0" or "1", and a value of each fine adjustment control bit may be "0" or "1".

Frequency steps of the W fine adjustment cells in the coarse adjustment cell i may be all equal, or partially equal, or not equal to each other.

Frequency steps of the X coarse adjustment cells may be all equal, or partially equal, or not equal to each other.

Optionally, in some possible implementations of the present disclosure, if the Y coarse adjustment control bits are a first value, the output from the logic cell of the coarse adjustment cell i is used to control all the W fine adjustment cells in the coarse adjustment cell i to work; or if the Y coarse adjustment control bits are a second value, the output from the logic cell of the coarse adjustment cell i is used to control all the W fine adjustment cells in the coarse adjustment cell i not to work; or if the Y coarse adjustment control bits are a third value, the logic cell of the coarse adjustment cell i controls, based on a value of the W fine adjustment control bits, some of the W fine adjustment cells in the coarse adjustment cell i to work. The first value, the second value, and the third value are different from each other.

It can be understood that, in the foregoing implementation example, if the Y coarse adjustment control bits input to the logic cell of the coarse adjustment cell i are the first value, the logic cell of the coarse adjustment cell i controls, regardless of the value of the W fine adjustment control bits input to the logic cell of the coarse adjustment cell i, all the W fine adjustment cells in the coarse adjustment cell i to work, that is, the W fine adjustment control bits input to the logic cell of the coarse adjustment cell i are considered to be invalid in this case.

It can be understood that, in the foregoing implementation example, if the Y coarse adjustment control bits input to the logic cell of the coarse adjustment cell i are the second value, the logic cell of the coarse adjustment cell i controls, regardless of the value of the W fine adjustment control bits input to the logic cell of the coarse adjustment cell i, all the W fine adjustment cells in the coarse adjustment cell i not to work, that is, the W fine adjustment control bits input to the logic cell of the coarse adjustment cell i are considered to be invalid in this case.

It can be understood that, in the foregoing implementation example, if the Y coarse adjustment control bits input to the logic cell of the coarse adjustment cell i are the third value, the logic cell of the coarse adjustment cell i controls, based on the value of the W fine adjustment control bits, some of the W fine adjustment cells in the coarse adjustment cell i to work, that is, the W fine adjustment control bits input to the logic cell of the coarse adjustment cell i are considered to be valid in this case.

For example, if Y is equal to 2, the first value may be "00", "11", "01", or "10". The second value may be any value that is in the foregoing four possible values and that is different from the first value. The third value may be any value that is in the foregoing four possible values and that is different from the first value and the second value. Specifically, for example, the first value may be "11", the second value may be "00", and the third value may be "01" or "10". The values may be analogized if Y is equal to another value.

Optionally, in some possible implementations of the present disclosure, there is a one-to-one correspondence between the W fine adjustment cells in the coarse adjustment cell i and the W fine adjustment control bits input to the logic cell of the coarse adjustment cell i. If the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 1 to work, and control a fine adjustment cell that is in the W fine adjustment cells in the coarse adjustment cell i and that is corresponding to a fine adjustment control bit whose value is 0 not to work (that is, the fine adjustment cell is disabled); or if the Y coarse adjustment control bits are the third value, the output from the logic cell of the coarse adjustment cell i is used to control a fine adjustment cell that is in the W fine adjustment cells in the coarse adjustment cell i and that is corresponding to a fine adjustment control bit whose value is 0 to work, and control a fine adjustment cell that is in the W fine adjustment cells in the coarse adjustment cell i and that is corresponding to a fine adjustment control bit whose value is 1 not to work.

Optionally, in some possible implementations of the present disclosure, the set including the W fine adjustment control bits is equal to the set including the B fine adjustment control bits (that is, W is equal to B). Each coarse adjustment cell in the coarse adjustment cell array shares the W fine adjustment control bits.

Optionally, in some possible implementations of the present disclosure, two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

Optionally, in some possible implementations of the present disclosure, the coarse adjustment row-column decoder includes A coarse adjustment control bit output cables, and the A coarse adjustment control bits are in a one-to-one correspondence with the A coarse adjustment control bit output cables. That is, coarse adjustment control bits in the A coarse adjustment control bits are output by using different coarse adjustment control bit output cables in the A coarse adjustment control bit output cables.

Optionally, in some possible implementations of the present disclosure, the fine adjustment row-column decoder includes B fine adjustment control bit output cables, and the B fine adjustment control bits are in a one-to-one correspondence with the B fine adjustment control bit output cables. That is, fine adjustment control bits in the B fine adjustment control bits are output by using different fine adjustment control bit output cables in the B fine adjustment control bit output cables.

Another circuit provided in an embodiment of the present disclosure may include any frequency synthesizer provided in the embodiments of the present disclosure.

An electronic device provided in an embodiment of the present disclosure may include any coarse adjustment cell array provided in the embodiments of the present disclosure.

Another electronic device provided in an embodiment of the present disclosure may include any digitally controlled oscillator provided in the embodiments of the present disclosure.

Another electronic device provided in an embodiment of the present disclosure may include any frequency synthesizer provided in the embodiments of the present disclosure.

The electronic device may be a mobile phone, a base station, a server, a router, or the like.

In the foregoing embodiments, the description of each embodiment has respective focuses. For a part that is not described in detail in an embodiment, refer to related descriptions in other embodiments.

In the several embodiments provided in this application, it should be understood that the disclosed apparatus may be implemented in another manner. For example, the described apparatus embodiment is merely an example. For example, the unit division is merely logical function division and may be other division in actual implementation. For example, multiple units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic or other forms.

The units described as separate parts may or may not be physically separate, and parts displayed as units may or may not be physical units, may be located in one position, or may be distributed on multiple network units. Some or all of the units may be selected according to actual requirements to achieve the objectives of the solutions of the embodiments.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in a form of a software functional unit and sold or used as an independent product, the integrated unit may be stored in a computer-readable storage medium. Based on such an understanding, the technical solutions of the present disclosure essentially, or the part contributing to the prior art, or all or a part of the technical solutions may be implemented in a form of a software product. The software product is stored in a storage medium and includes several instructions for instructing a computer device (which may be a personal computer, a server, a network device, or the like) to perform all or a part of the steps of the methods described in the embodiments of the present disclosure. The foregoing storage medium includes any medium that can store program code, such as a USB flash drive, a read-only memory (ROM), a random access memory (RAM), a removable hard disk, a magnetic disk, or an optical disc.

The foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present disclosure.

What is claimed is:

1. A coarse adjustment cell array applied to a digitally controlled oscillator, the coarse adjustment cell array comprising:
    X coarse adjustment cells each comprising a logic cell and W fine adjustment cells; and
    at least one logic cell of a coarse adjustment cell (i) is configured to receive Y coarse adjustment control bits and W fine adjustment control bits and control the W fine adjustment cells, wherein Y is an integer greater than 1, X is an integer greater than 1, and W is an integer greater than 1, wherein when the Y coarse adjustment control bits are a third value, the logic cell of the coarse adjustment cell (i) is configured to control, based on a value of the W fine adjustment control bits, some of the W fine adjustment cells in the coarse adjustment cell (i) to work.

2. The coarse adjustment cell array according to claim 1, wherein:
    when the Y coarse adjustment control bits are a first value, the logic cell of the coarse adjustment cell (i) is configured to control all the W fine adjustment cells in the coarse adjustment cell (i) to work; and when the Y coarse adjustment control bits are a second value, the logic cell of the coarse adjustment cell (i) is configured to control all the W fine adjustment cells in the coarse adjustment cell (i) not to work, wherein the first value, the second value, and the third value are different from each other.

3. The coarse adjustment cell array according to claim 2, wherein:

there is a one-to-one correspondence between the W fine adjustment cells in the coarse adjustment cell (i) and the W fine adjustment control bits; and when the Y coarse adjustment control bits are the third value, the output from the logic cell of the coarse adjustment cell (i) is used to control a fine adjustment cell that is in the W fine adjustment cells in the coarse adjustment cell (i) and that is corresponding to a fine adjustment control bit whose value is 1 to work, and control a fine adjustment cell that is in the W fine adjustment cells in the coarse adjustment cell (i) and that is corresponding to a fine adjustment control bit whose value is 0 not to work; or when the Y coarse adjustment control bits are the third value, the output from the logic cell of the coarse adjustment cell (i) is used to control a fine adjustment cell that is in the W fine adjustment cells in the coarse adjustment cell (i) and that is corresponding to a fine adjustment control bit whose value is 0 to work, and control a fine adjustment cell that is in the W fine adjustment cells in the coarse adjustment cell (i) and that is corresponding to a fine adjustment control bit whose value is 1 not to work.

4. The coarse adjustment cell array according to claim 1, wherein W is equal to $2^n$, and n is a positive integer.

5. The coarse adjustment cell array according to claim 1, wherein Y is equal to 2.

6. A digitally controlled oscillator, comprising:
a coarse adjustment cell array, comprising:
X coarse adjustment cells each comprising a logic cell and W fine adjustment cells, and
at least one logic cell of a coarse adjustment cell (i) is configured to receive Y coarse adjustment control bits and W fine adjustment control bits and control the W fine adjustment cells, wherein Y is an integer greater than 1, X is an integer greater than 1, and W is an integer greater than 1;
a coarse adjustment row-column decoder configured to decode an input first control signal and output A coarse adjustment control bits;
a fine adjustment row-column decoder configured to decode an input second control signal and output B fine adjustment control bits; and
wherein a set formed by the Y coarse adjustment control bits is a subset of a set comprising the A coarse adjustment control bits, and a set comprising the W fine adjustment control bits is a subset of a set comprising the B fine adjustment control bits.

7. The digitally controlled oscillator according to claim 6, wherein the set comprising the W fine adjustment control bits is equal to the set comprising the B fine adjustment control bits, and each coarse adjustment cell in the coarse adjustment cell array shares the W fine adjustment control bits.

8. The digitally controlled oscillator according to claim 6, wherein two adjacent coarse adjustment cells in the coarse adjustment cell array share one coarse adjustment control bit in the A coarse adjustment control bits, and any two adjacent coarse adjustment cells in the coarse adjustment cell array share different coarse adjustment control bits in the A coarse adjustment control bits.

9. The digitally controlled oscillator according to claim 6, wherein the coarse adjustment row-column decoder comprises:

A coarse adjustment control bit output cables, and the A coarse adjustment control bits are in a one-to-one correspondence with the A coarse adjustment control bit output cables.

10. The digitally controlled oscillator according to claim 6, wherein the fine adjustment row-column decoder comprises:

B fine adjustment control bit output cables, and the B fine adjustment control bits are in a one-to-one correspondence with the B fine adjustment control bit output cables.

11. A frequency synthesizer, comprising:
a digitally controlled oscillator, comprising:
a coarse adjustment cell array, comprising:
X coarse adjustment cells each comprising a logic cell and W fine adjustment cells; and
at least one logic cell of a coarse adjustment cell (i) is configured to receive Y coarse adjustment control bits and W fine adjustment control bits and control the W fine adjustment cells, wherein Y is an integer greater than 1, X is an integer greater than 1, and W is an integer greater than 1,
a coarse adjustment row-column decoder configured to decode a first control signal and output A coarse adjustment control bits,
a fine adjustment row-column decoder configured to decode a second control signal and output B fine adjustment control bits, and
wherein a set formed by the Y coarse adjustment control bits is a subset of a set comprising the A coarse adjustment control bits, and a set comprising the W fine adjustment control bits is a subset of a set comprising the B fine adjustment control bits; and
a digital logic cell configured to output the first control signal to the coarse adjustment row-column decoder and output the second control signal to the fine adjustment row-column decoder.

12. The frequency synthesizer according to claim 11, wherein the digital logic cell is configured to:
output the first control signal to the coarse adjustment row-column decoder according to a frequency dividing control word and a reference frequency that are input to the digital logic cell; and
output the second control signal to the fine adjustment row-column decoder according to the frequency dividing control word and the reference frequency that are input to the digital logic cell.

* * * * *